US007026765B2

(12) United States Patent
Lee

(10) Patent No.: US 7,026,765 B2
(45) Date of Patent: Apr. 11, 2006

(54) APPARATUS AND METHOD FOR ENERGY RECOVERY

(75) Inventor: Eung Kwan Lee, Daegu (KR)

(73) Assignee: LG Electronics Inc., Seoul (KR)

( * ) Notice: Subject to any disclaimer, the term of this patent is extended or adjusted under 35 U.S.C. 154(b) by 485 days.

(21) Appl. No.: 10/305,068

(22) Filed: Nov. 27, 2002

(65) Prior Publication Data

US 2003/0099024 A1 May 29, 2003

(30) Foreign Application Priority Data

Nov. 28, 2001 (KR) ...................... 10-2001-0074477

(51) Int. Cl.
*G09G 3/10* (2006.01)
*H03K 3/00* (2006.01)

(52) U.S. Cl. .................................... 315/169.1; 327/111

(58) Field of Classification Search ............. 315/169.1, 315/167; 345/60, 71; 327/111
See application file for complete search history.

(56) References Cited

U.S. PATENT DOCUMENTS 4,866,349 A * 9/1989 Weber et al. ............ 315/169.4
6,011,355 A * 1/2000 Nagai ...................... 315/169.3
6,050,999 A * 4/2000 Paraschac et al. .......... 606/107
6,160,531 A * 12/2000 Chen et al. .................. 345/60
2003/0080925 A1* 5/2003 Lee ............................. 345/60
2003/0193450 A1* 10/2003 Lee et al. ..................... 345/60

FOREIGN PATENT DOCUMENTS

JP 10-301530 11/1998

OTHER PUBLICATIONS

KR Office Action dated Dec. 22, 2004.

* cited by examiner

*Primary Examiner*—Wilson Lee
*Assistant Examiner*—Angela M Lie
(74) *Attorney, Agent, or Firm*—Fleshner & Kim, LLP

(57) ABSTRACT

An energy recovery apparatus including a sustaining voltage source for applying a sustaining voltage to a first electrode and a second electrode formed on an upper substrate; a equivalent capacitive load formed between the first electrode and the second electrode; and a power source capacitor disposed between the sustaining voltage source and a ground voltage source, for being charged with a voltage charged in the equivalent capacitive load and preventing a voltage drop phenomenon when a voltage of the sustaining voltage source is applied to the equivalent capacitive load.

14 Claims, 9 Drawing Sheets

APPARATUS AND METHOD FOR ENERGY RECOVERY

BACKGROUND OF THE INVENTION

1. Field of the Invention

This invention relates to an energy recovery apparatus, and more particularly to an apparatus and a method for energy recovery without a source capacitor.

2. Description of the Related Art

Recently, there has been developed various flat panel display devices reduced in weight and bulk that are capable of eliminating disadvantages associated with cathode ray tubes CRT. Such flat panel display devices include a liquid crystal display LCD, a field emission display FED, a plasma display panel PDP and an electro-luminescence EL panel, etc.

The PDP among these flat panel display devices is a display device using gas discharge and has an advantage that it is easy to be made on a large scale. A typical PDP is a three-electrode AC surface discharge PDP that has three electrodes, as shown in FIG. 1, and is driven by AC voltage.

Referring to FIG. 1, a discharge cell of the three-electrode AC surface-discharge PDP includes a first electrode 12Y and a second electrode 12Z formed on an upper substrate 10, and an address electrode 20X formed on a lower substrate 18.

On the upper substrate 10 provided with the first electrode 12Y and the second electrode 12Z in parallel, an upper dielectric layer 14 and a passivation film 16 are disposed. Wall charges generated upon plasma discharge are accumulated in the upper dielectric layer 14. The passivation film 16 prevents a damage of the upper dielectric layer 14 caused by a sputtering during the plasma discharge and improves the emission efficiency of secondary electrons. This passivation film 16 is usually made from magnesium oxide (MgO).

A lower dielectric layer 22 and barrier ribs 24 are formed on the lower substrate 18 provided with the address electrode 20X. The surfaces of the lower dielectric layer 22 and the barrier ribs 24 are coated with a phosphorus 26. The address electrode 20X is formed in a direction crossing the first electrode 12Y and the second electrode 12Z. The barrier ribs 24 are formed in parallel to the address electrode 20X to prevent an ultraviolet ray and a visible light generated by a discharge from being leaked to the adjacent discharge cells. The phosphorus 26 is excited by the ultraviolet ray generated during the plasma discharge to generate any one of red, green and blue visible light rays. There is an inactive gas for a gas discharge injected into a discharge space defined between the upper and lower substrate 10 and 18 and the barrier ribs 24.

Such a three-electrodes AC surface discharge PDP is divided into a plurality of sub-fields to be driven and there are lights emitted as frequent as the number of times proportional to a weight of video data in each sub-field period so as there to be a gray level display carried out. The sub-field SF1 to SF8 is divided again into a reset period, an address period, a sustaining period and an erasure period and is driven.

Herein, there are uniform wall charges formed in a discharge cell during the reset period. There is an address discharge generated in accordance with a logical value of video data during the address period. There is a discharge sustained in the discharge cell, in which the address discharge has been generated, during the sustaining period. There is a sustaining discharge, which was generated during the sustaining period, eliminated during the erasure period.

There is a high voltage of hundreds volt or more needed in the address discharge and the sustaining discharge of the AC surface discharge PDP, which is driven in this way. Accordingly, there is an energy recovery apparatus used for minimizing a driving power necessary for the address discharge and the sustaining discharge. The energy recovery apparatus recovers the voltage between the first electrode 12Y and the second electrode 12Z and makes use of the recovered voltage as the driving voltage for the next discharge.

FIG. 2 illustrates a circuit diagram of an energy recovery apparatus formed in a first electrode in order to recover a sustaining discharge voltage.

Referring to FIG. 2, an energy recovery apparatus according to the related art includes an inductor L connected between a panel capacitor Cp and a source capacitor Cs; a first switch S1 and a third switch S3 connected between the source capacitor Cs and the inductor L in parallel; a second switch S2 and a fourth switch S4 connected between the panel capacitor Cp and the inductor L in parallel; and a power source capacitor Cv connected between a reference voltage source Vs and a ground GND.

The panel capacitor Cp is equivalent to a capacitance formed between the first electrode Y and the second electrode Z. The second switch is connected to the reference voltage source Vs, and the fourth switch is connected to the ground GND. The source capacitor Cs recovers the voltage charged in the panel capacitor Cp upon the sustaining discharge to be charged with and applies the charged voltage to the panel capacitor Cp.

The power source capacitor Cv prevents the reference voltage source Vs from being dropped when the reference voltage source Vs is applied. In other words, the capacitor Cv prevents a swing of the reference voltage source Vs when the reference voltage source Vs is applied, thereby always applying a uniform voltage of the reference voltage source Vs.

The source capacitor Cs has a capacitance capable of charging a voltage of Vs/2 corresponding to a half value of the reference voltage source Vs. The inductor L forms a resonance circuit together with the panel capacitor Cp. The first to fourth switches S1 to S4 control the flow of current. The energy recovery apparatus formed in the second electrode Z and the energy recovery apparatus formed in the first electrode Y are symmetrically formed with respect to the panel capacitor Cp.

On the other hand, a fifth diode D5 and a sixth diode D6 disposed between the first switch S1 and the inductor L and between the third switch S3 and the inductor L respectively prevent electric current from flowing in a reverse direction. Also, the first to fourth switches S1 to S4 have internal diodes D1 to D4 additionally installed to be connected to each of switches S1 to S4 in parallel.

FIG. 3 illustrates a diagram representing on/off timing of the switches and an output waveform of a panel capacitor, shown in FIG. 2.

There will be an operation process described in detail assuming that there are the panel capacitor Cp charged with a voltage of 0V and the source capacitor Cs charged with a voltage of Vs/2 before a period T1 of time.

During the period T1 of time, the first switch S1 is turned on, so that there is a current path formed linking the source capacitor Cs, the first switch S1, the inductor L and the panel capacitor Cp. If the current path is formed, the voltage of Vs/2 charged in the source capacitor Cs is applied to the panel capacitor Cp. At this moment, because the inductor L and the panel capacitor Cp form a serial resonance circuit, the panel capacitor Cp is charged with the voltage Vs twice as much voltage as the source capacitor Cs.

During a period T2 of time, the second switch S2 is turned on. If the second switch S2 is turned on, the voltage of the reference voltage source Vs is applied to the first electrode Y. The voltage of the reference voltage source Vs applied to the first electrode Y prevents the voltage of the panel capacitor Cp from dropping below the reference voltage source Vs to make the sustaining discharge generated in a normal manner. On the other hand, because the voltage of the panel capacitor Cp rose to Vs during the period T1, the driving power that is applied from the outside for generating the sustaining discharge may be minimized.

During a period T3 of time, the first switch S1 is turned off. At this moment, the first electrode Y sustains the voltage of the reference voltage source Vs during the period T3.

During a period T4 of time, the second switch S2 is turned off and the third switch S3 is turned on at the same time. When the third switch S3 is turned on, there is a current path formed linking the panel capacitor Cp, the inductor L, the third switch S3 and the source capacitor Cs, so that the voltage charged in the panel capacitor Cp is recovered to the source capacitor Cs. At this moment, the source capacitor Cs is charged with the voltage of Vs/2.

During a period T5 of time, the third switch S3 is turned off and the fourth switch S4 is turned on at the same time. When the fourth switch S4 is turned on, there is a current path formed between the panel capacitor Cp and the ground GND, so that the voltage of the panel capacitor Cp drops to 0V.

During a period T6 of time, the state of the period T5 is sustained for a specified period of time. Actually, the AC driving pulse applied to the first electrode Y and the second electrode Z is obtained as the periods T1 to T6 are periodically repeated.

However, because the source capacitor has been installed to have high capacitance in the energy recovery apparatus according to the related art, there is a big space required for it.

SUMMARY OF THE INVENTION

Accordingly, it is an object of the present invention to provide an energy recovery apparatus without a source capacitor.

In order to achieve these and other objects of the invention, an energy recovery apparatus according to an aspect of the present invention includes a sustaining voltage source for applying a sustaining voltage to a first electrode and a second electrode formed on an upper substrate; a equivalent capacitive load formed between the first electrode and the second electrode; and a power source capacitor disposed between the sustaining voltage source and a ground, for being charged with a voltage charged in the equivalent capacitive load and preventing a voltage drop phenomenon when a voltage of the sustaining voltage source is applied to the equivalent capacitive load.

The energy recovery apparatus further includes a first switch and a third switch disposed between the sustaining voltage source and the ground in parallel to the power source capacitor; a second switch and a fourth switch disposed between the sustaining voltage source and the ground in parallel to the first and third switches; and an inductor with its first end connected to the first and third switches and its second end connected to the second and fourth switches.

The second end of the inductor is connected to the equivalent capacitive load.

The first and second switches are connected to the sustaining voltage source and the third and fourth switches are connected to the ground.

The energy recovery apparatus further includes a first internal diode connected in parallel to the first switch, having its cathode connected to the sustaining voltage source and its anode connected to the inductor; a second internal diode connected in parallel to the second switch, having its cathode connected to the sustaining voltage source and its anode connected to the inductor; a third internal diode connected in parallel to the third switch, having its cathode connected to the inductor and its anode connected to the ground; and a fourth internal diode connected in parallel to the fourth switch, having its cathode connected to the inductor and its anode connected to the ground voltage source.

The energy recovery apparatus further includes a first diode disposed between the first switch and the power source capacitor; a second diode disposed between the third switch and the first end of the inductor; a third diode disposed between the sustaining voltage source and the second end of the inductor; and a fourth diode disposed between the ground and the second end of the inductor.

Herein, there is a designated current applied to the ground voltage source via the inductor by a voltage charged in the power source capacitor when the first and fourth switches are turned on, and there is a designated current applied from the ground to the equivalent capacitive load via the third internal diode when the first and fourth switches are turned off.

Herein, there is a designated current applied to the ground via the inductor by a voltage charged in the power source capacitor when the first and fourth switches are turned on, and there is a designated current applied from the ground to the equivalent capacitive load via the fourth diode when the first and fourth switches are turned off.

Herein, a voltage charged in the equivalent capacitive load and a charging gradient are determined by turn-on times of the first and fourth switches.

Herein, a first voltage with a first gradient is charged in the equivalent capacitive load when the first and fourth switches are turned on for a first period of time, and a voltage higher than the first voltage with a second gradient higher than the first gradient is charged in the equivalent capacitive load when the first and fourth switches are turned on for longer than the first period of time.

Herein, there is a designated current applied to the ground via the inductor by a voltage charged in the equivalent capacitive load when the third switch is turned on, and there is a designated current applied from the ground to the power source capacitor via the first internal diode when the third switch is turned off and the fourth switch is turned on at the same time.

Herein, there is a designated current applied to the ground via the inductor by a voltage charged in the equivalent capacitive load when the third switch is turned on, and there is a designated current applied from the ground to the power source capacitor via the third diode when the third switch is turned off and the fourth switch is turned on at the same time.

Herein, a voltage charged in the power source capacitor and a charging gradient are determined by a turn-on time of the third switch.

The energy recovery apparatus further includes at least one or more other inductors connected in parallel to the inductor.

Herein, an inductance of said other inductor connected in parallel to the inductor is set different from an inductance of the inductor.

Herein, the energy recovery apparatus also includes an inductor with a low inductance among the inductors provides a path for a current charged in the equivalent capacitive load, and an inductor with a high inductance among the inductors provides a path for a current discharged from the equivalent capacitive load.

A method for energy recovery with a equivalent capacitive load formed between a first electrode and a second electrode formed on an upper substrate, a sustaining voltage source applying a sustaining voltage to the first electrode and the second electrode, and a power source capacitor disposed between the sustaining voltage source and a ground according to another aspect of the present invention includes charging the equivalent capacitive load with a first current applied from the power source capacitor to the ground via the inductor; and charging the power source capacitor with a second current applied from the equivalent capacitive load to the ground via the inductor.

In the method, a third current corresponding to the first current is applied from the ground to the equivalent capacitive load via the inductor when the first current is stopped.

In the method, a third current corresponding to the second current is applied from the ground to the equivalent capacitive load via the inductor when the second current is stopped.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Figure 4:
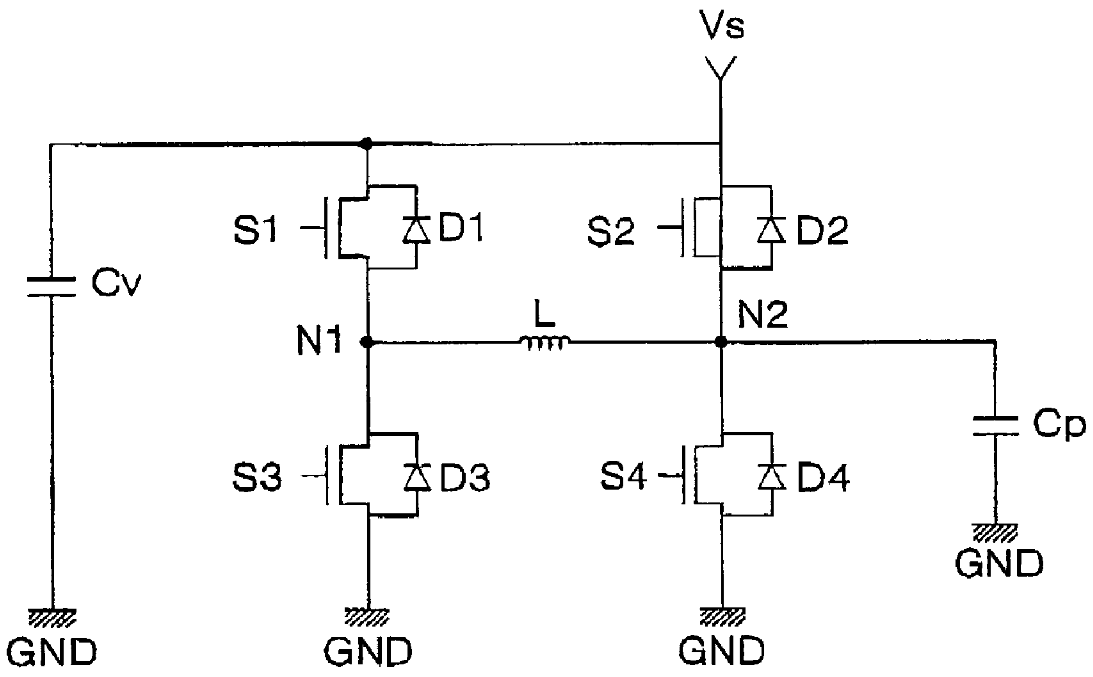
FIG. 4 illustrates a circuit diagram of an energy recovery apparatus according to an embodiment of the present invention.

FIG. 4 illustrates a circuit diagram of an energy recovery apparatus according to an embodiment of the present invention.

Referring to FIG. 4, the energy recovery apparatus includes a power source capacitor Cv disposed between a reference voltage source Vs and a ground voltage source GND; a first switch S1 and a third switch S3 disposed between the reference voltage source Vs and the ground GND in parallel to the power source capacitor Cv; a second switch S2 and a fourth switch S4 disposed between the reference voltage source Vs and the ground GND in parallel to the power source capacitor Cv; an inductor L disposed between a first node N1 and a second node N2; and a panel capacitor Cp connected to the inductor L. Also illustrated is a controller 40 for controlling the switches.

The panel capacitor Cp is equivalent to a capacitance formed between the first electrode and the second electrode. Such a panel capacitor Cp has a low capacitance, e.g., about 300 nF. The first and second switches S1 and S2 are connected to the reference voltage source Vs, and the third and fourth switches S3 and S4 are connected to the ground GND.

The power source capacitor Cv recovers the voltage charged in the panel capacitor Cp upon a sustaining discharge, and then applies the charged voltage to the panel capacitor Cp again. Further, when the voltage of the reference voltage source Vs is applied to the panel capacitor Cp, the power capacitor Cv prevents a swing of the voltage to always make a uniform voltage applied to the panel capacitor Cp.

The first to fourth switches S1 to S4 control the flow of current. There are internal diodes D1 to D4 installed, which are connected in parallel to the switches S1 to S4 respectively.

Figure 1:
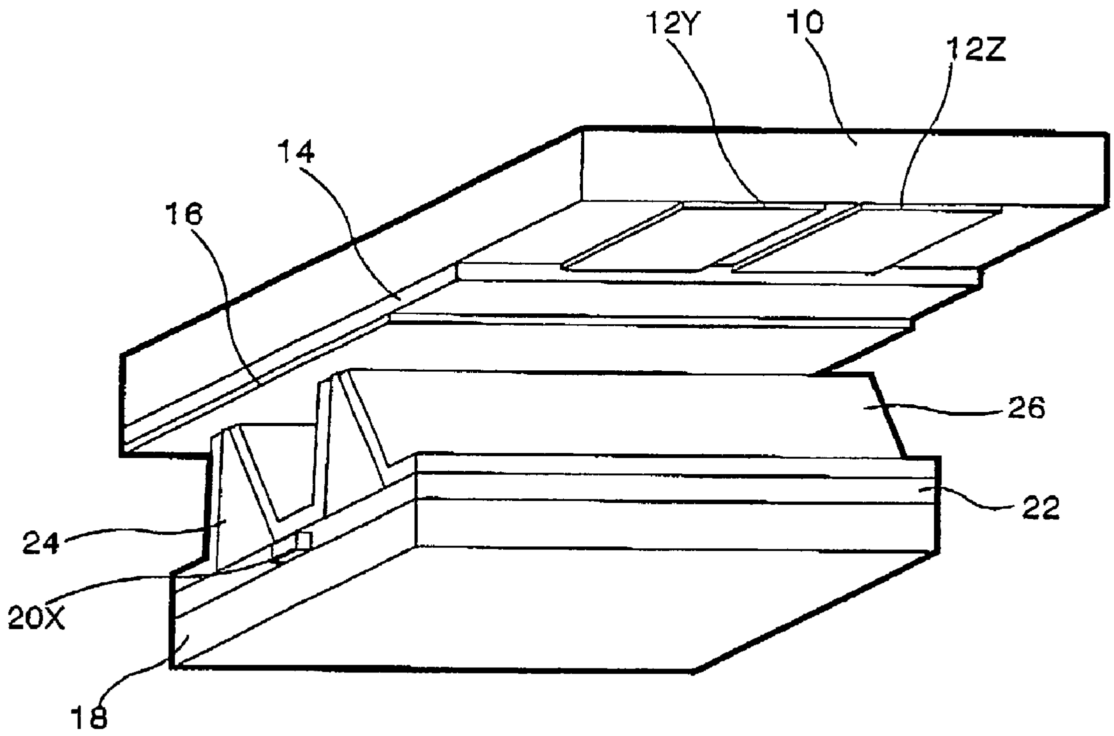
FIG. 1 RELATED ART
FIG. 1 illustrates a perspective view of a discharge cell structure of a three-electrodes AC surface discharge PDP according to the related art.
Figure 2:
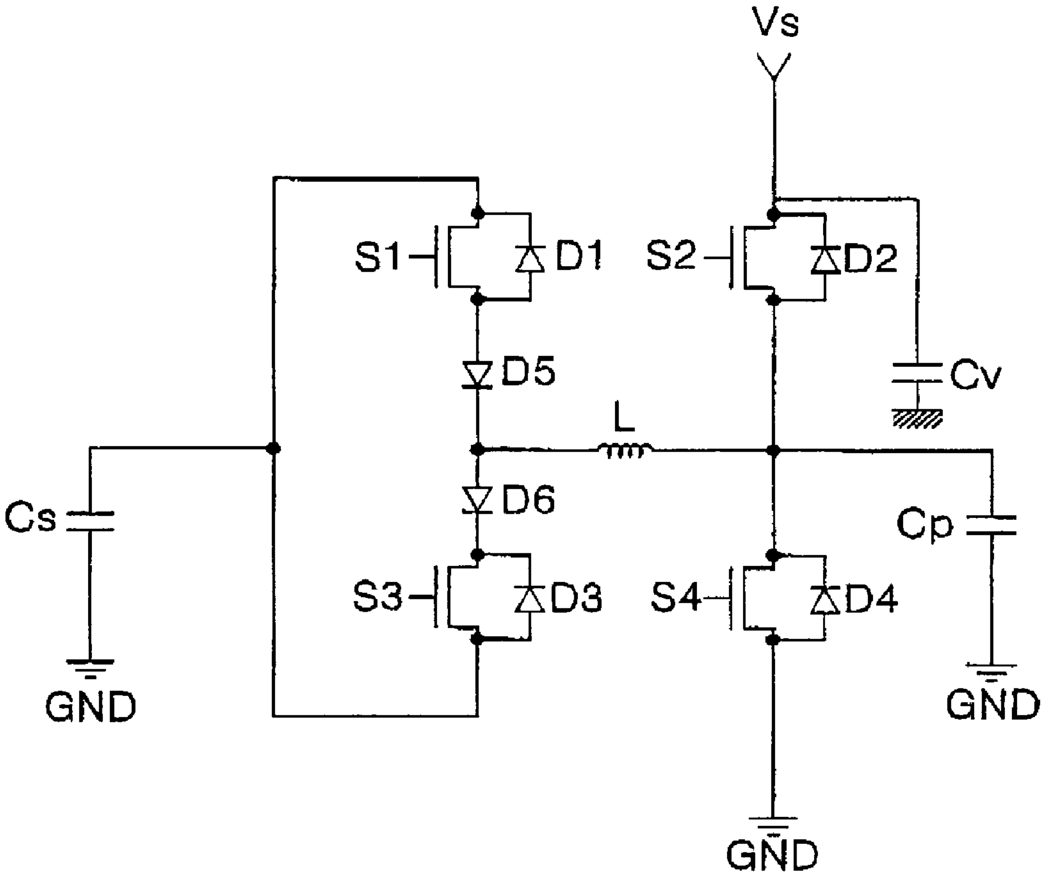
FIG. 2 RELATED ART
FIG. 2 illustrates a circuit diagram of an energy recovery apparatus according to the related art.
Figure 3:
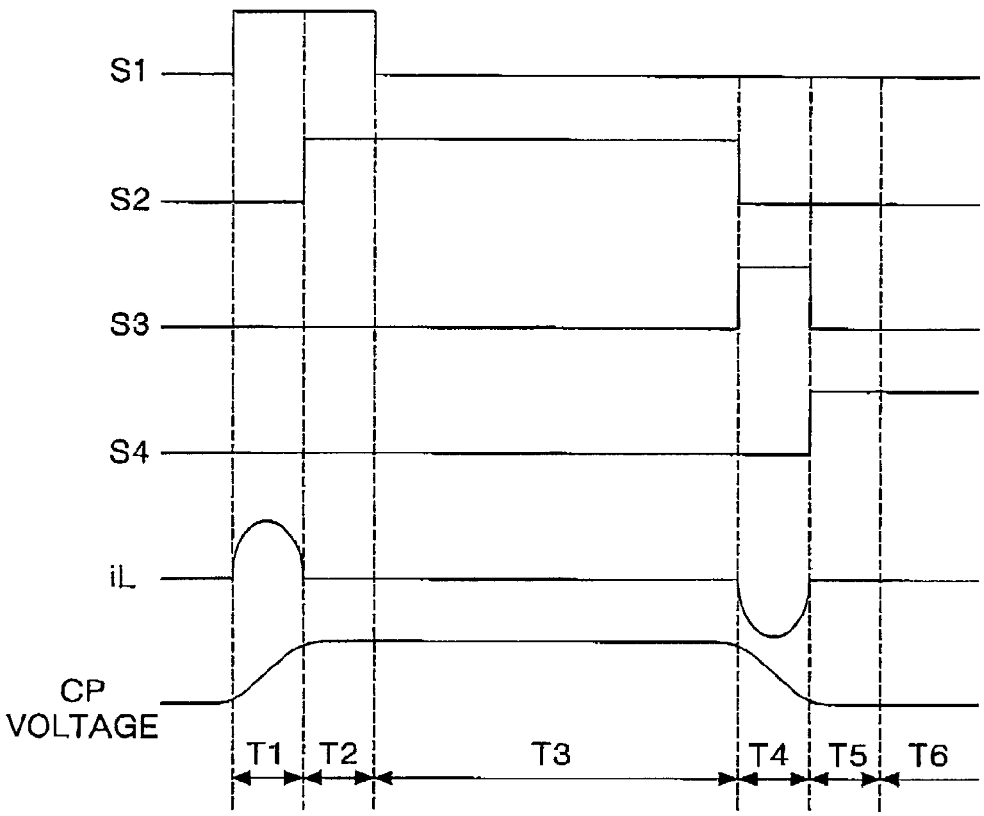
FIG.3 RELATED ART
FIG. 3 is a diagram representing on/off timings of switches and an output waveform of a panel capacitor shown in FIG. 2.

Cathodes of the first and second diodes D1 and D2 are connected to the reference voltage source Vs, and anodes thereof are connected to the inductor L. Cathodes of the third and fourth diodes D3 and D4 are connected to the inductor, and anodes thereof are connected to the ground GND. When these are compared with the conventional energy recovery circuit shown in FIG. 2, it can be seen that the source capacitor Cs is eliminated in the energy recovery apparatus of the present invention.

Figure 5:
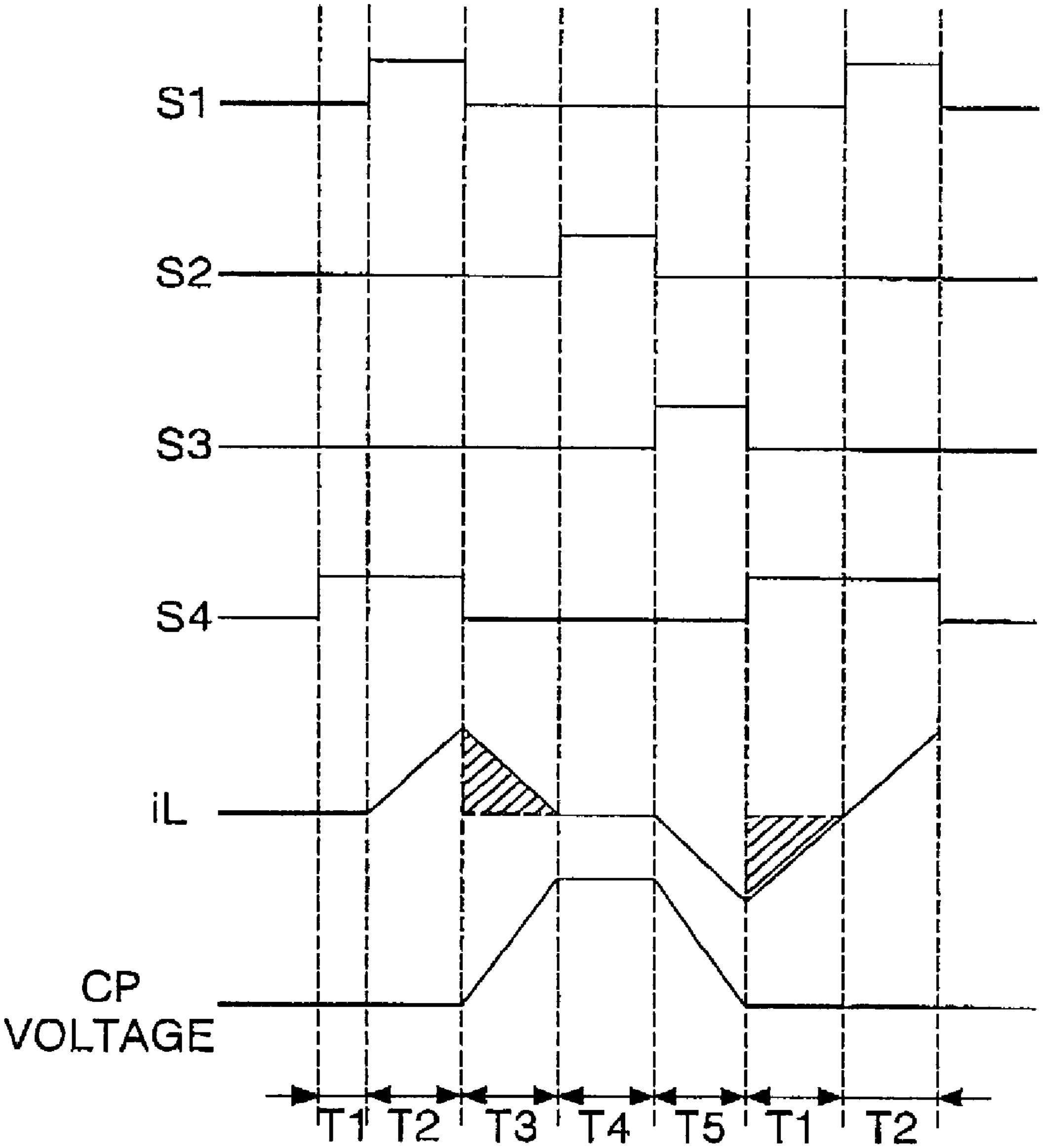
FIG. 5 is a diagram representing on/off timings of switches and an output waveform of a panel capacitor shown in FIG. 4.

FIG. 5 is a diagram representing on/off timings of switches and an output waveform of a panel capacitor shown in FIG. 4.

There will be an operation process described in detail assuming that there are the panel capacitor Cp charged with a voltage of 0V and the power source capacitor Cv charged with a designated voltage before a period T1 of time.

During the period T1 of time, the fourth switch S4 is turned on. During a period T2 of time, the first switch is turned on, so that there is a current path formed linking the first switch S1, the inductor L, the fourth switch S4 and the ground GND. If the current path is formed, the voltage charged in the power source capacitor Cv is applied to the ground GND. At this moment, there flows a current proportional to a turn-on timing of the first switch S1 in the inductor L as shown in FIG. 5.

During a period T3 of time, the first and fourth switches S1 and S4 are turned off. If the first and fourth switches are turned off in this way, there is a designated current applied to the inductor L via the ground GND and the third diode D3 by the flow of the current which has flowed during the period T2. The current applied to the inductor L is applied to the panel capacitor Cp via the inductor L.

If a designated current is applied to the panel capacitor Cp, the panel capacitor Cp is charged with a designated voltage. At this moment, the amplitude of the voltage charged in the panel capacitor Cp is determined by a turn-on time of the first and fourth switches S1 and S4. In the same manner, the gradient of the voltage charged in the panel capacitor Cp, i.e., the gradient of a sustaining pulse, is determined by the turn-on time of the first and fourth switches S1 and S4.

Figure 6:
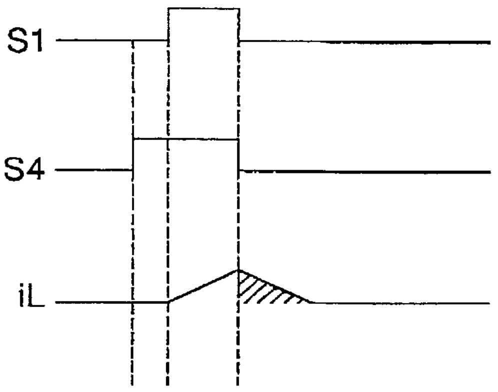
FIGS. 6 and 7 are diagrams representing currents that flow in an inductor in accordance with on/off timings of a first and a third switching device shown in FIG. 4.
Figure 7:
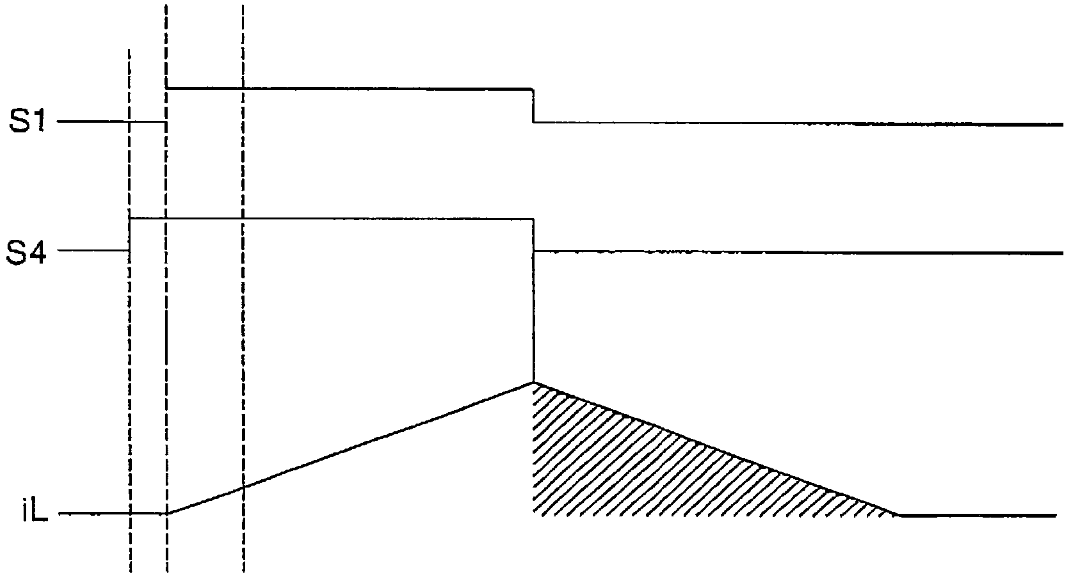

To described this more particularly, if the turn-on times of the first and fourth switches S1 and S4 are set at below a designated time, as in FIG. 6, a current below a designated amount flows in the inductor L. For example, it is assumed that a current of 4 mA flows in the inductor L when the first and fourth switches S1 and S4 are turned on. There flows a current gradually lowered from 4 mA when the first and fourth switches S1 and S4 are turned off. At this moment, the current gradually lowered from 4 mA is applied to the panel capacitor Cp, and the panel capacitor Cp is charged with a voltage having a low gradient by a current value applied to itself. FIG. 7 illustrates the turn-on times being longer than in FIG. 6.

On the other hand, turn-on times of the first and fourth switches S1 and S4 are set at over a designated time, as in FIG. 7, more than a designated current flow in the inductor L. For instance, it is assumed that a current of 10 mA flows in the inductor L when the first and fourth switches S1 and S4 are tuned on for a designated time. Accordingly, when the first and fourth switches S1 and S4 are turned off, there is a current gradually lowered from 10 mA flows in the inductor L. At this moment, a current gradually lowered from 10 mA is applied to the panel capacitor Cp, the panel capacitor Cp is charged with a voltage having a high gradient by the current value applied to itself.

In other words, when the turn-on time of the first and fourth switches S1 and S4 are set long, a lot of current is applied. Accordingly, the panel capacitor Cp is charged with a voltage in a rapid time, i.e., high gradient. Further, if the turn-on time of the first and fourth switches S1 and S4 are set long, a lot of current is applied to the panel capacitor Cp and a high voltage is charged in it.

During a period T4 of time, the second switch S2 is turned on. If the second switch S2 is turned on, the voltage of the reference voltage source Vs is applied to the panel capacitor Cp. The voltage of the reference voltage source Vs applied to the panel capacitor Cp prevents the voltage of the panel capacitor Cp from dropping to below the reference voltage source Vs, so that a sustaining discharge is made to be generated in a normal manner.

As shown in FIG. 5, during a period T4 of time, the second switch is turned on such that a voltage from voltage source Vs is applied to the panel capacitor Cp. During a period T5 of time, the second switch S2 is turned-off, and the third switch S3 is turned on. If the third switch S3 is turned on, the voltage charged in the panel capacitor Cp is discharged to the ground GND via the inductor L and the third switch S3. At this moment, there flows a designated current in the inductor L.

During the period T1 after the period T5, the third switch S3 is turned off and the fourth switch S4 is turned on at the same time. If the fourth switch S4 is turned on, there is a designated current applied from the ground GND to the power source capacitor Cv via the first diode D1 by the flow of a current that flowed during the period T5. At this moment, the power source capacitor Cv is charged with a designated voltage.

On the other hand, in the same way as the period T3, the voltage charged in the power source capacitor Cv is proportional to the turn-on time of the third switch S3. In other words, if the turn-on time of the third switch S3 is set long, there is a high voltage is applied to the power source capacitor Cv. Further, if the turn-on time of the third switch S3 is set short, there is a low voltage applied to the power source capacitor Cv.

Figure 8:
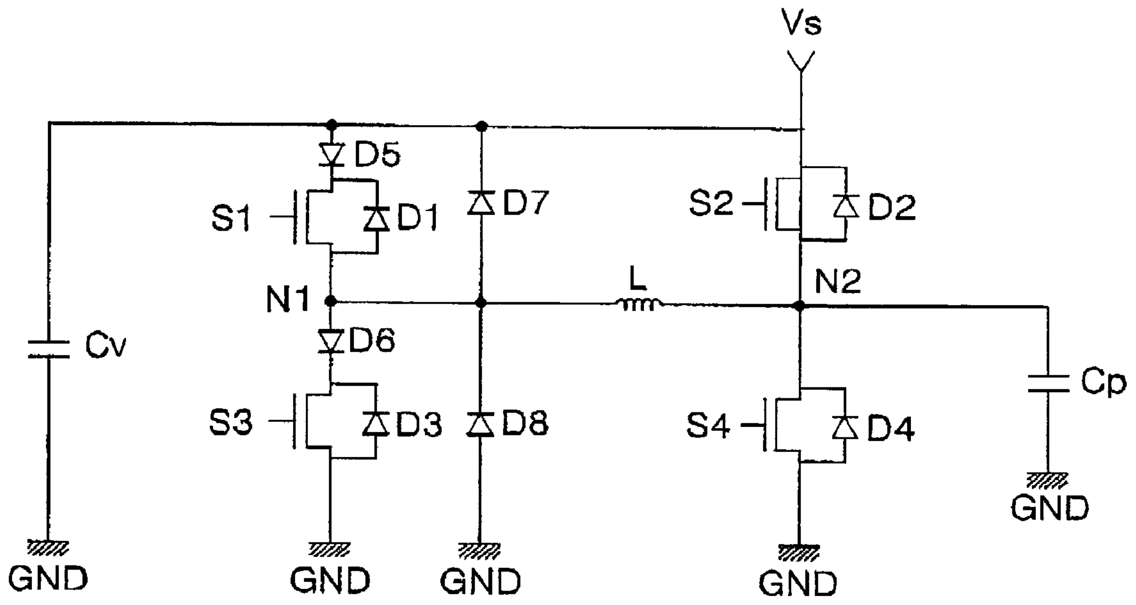
FIG. 8 illustrates a circuit diagram of an energy recovery apparatus according to another embodiment of the present invention.

On the other hand, the energy recovery apparatus of the present invention further includes a fifth diode D5, a sixth diode D6, a seventh diode D7 and an eighth diode D8, as in FIG. 8.

The fifth diode D5 is disposed between the first switch S1 and the power capacitor Cv. The sixth diode D6 is disposed between the inductor and the third switch S3. The seventh diode D7 is disposed between the reference voltage source Vs and the inductor L. The eighth diode D8 is disposed between the inductor L and the ground GND.

The fifth and sixth diodes D5 and D6 prevent a reverse current from flowing in the first and third switches S1 and S3. The eighth diode D8 applies a designated current from the ground GND to the inductor L via itself during the period T3 shown in FIG. 5. At this moment, there flows no current in the third switch S3 by the sixth diode D6.

The seventh diode D7 applies a designated current from the ground GND to the power source capacitor Cv via itself during the period T5 shown in FIG. 5. At this moment, there flows no current in the first switch S1 by the fifth diode D5.

Figure 9:
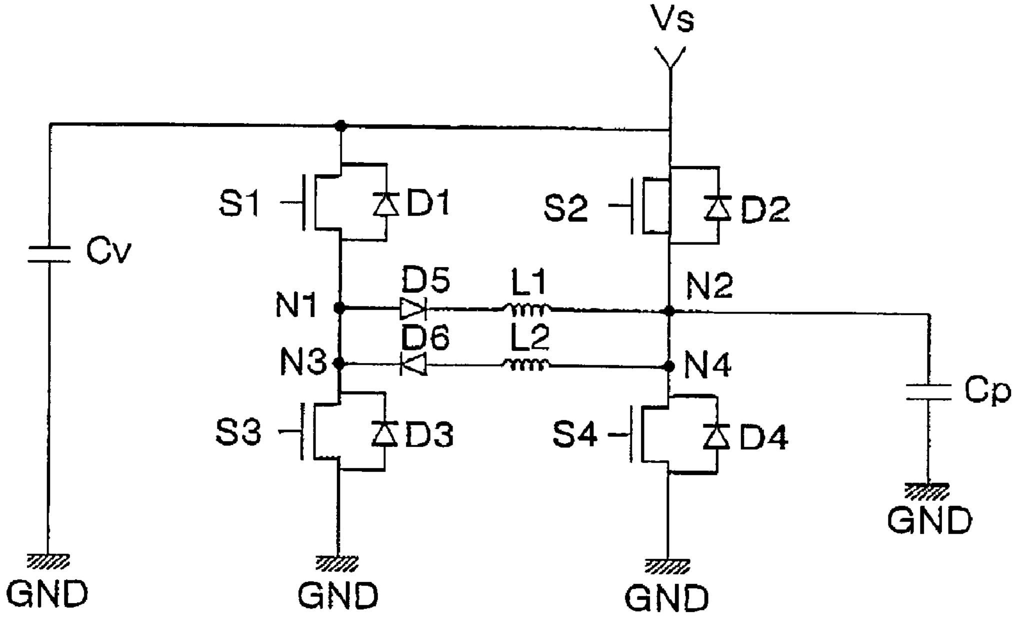
FIGS. 9 and 10 illustrate circuit diagrams of energy recovery apparatuses according to still another embodiment of the present invention.

FIG. 9 illustrates a circuit diagram of an energy recovery apparatus according to another embodiment of the present invention.

Referring to FIG. 9, the energy recovery apparatus includes a first inductor L1 providing a discharge path of a voltage charged in the power source capacitor Cv and a charging path of a current applied to the panel capacitor Cp; and a second inductor L2 providing a discharge path of a voltage charged in the panel capacitor Cp and a charging path of a current applied to the power source capacitor Cv.

The fifth diode D5 is disposed between the first inductor L1 and a first node N1 in order to prevent a reverse current. The sixth diode D6 is disposed between the second inductor L2 and a third node N3 in order to prevent a reverse current. There are a ninth diode D9 and a tenth diode D10 disposed to apply currents in different directions. Herein, the inductance of the second inductor L2 is set higher than the inductance of the first inductor L1.

The current discharged from the power source capacitor Cv is applied to the ground GND via the first switch S1, the fifth diode D5, the first inductor L1 and the fourth switch S4. At this moment, the current is applied from the ground GND to the panel capacitor Cp via the third internal diode D3, the fifth diode D5 and the first inductor L1.

The current discharged from the panel capacitor Cp is applied to the ground GND via the second inductor L2, the sixth diode D6 and the third switch S3. At this moment, the current charged in the power source capacitor Cv is applied from the ground GND to the power source capacitor Cv via the fourth internal diode D4, the second inductor L2, the sixth diode D6 and the first internal diode D1.

Figure 10:
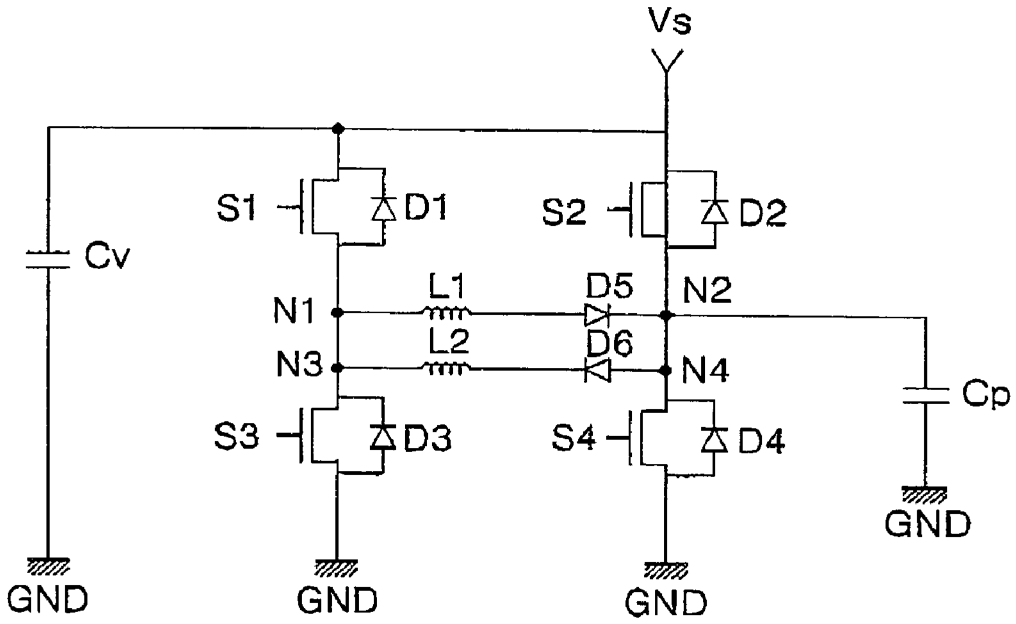

On the other hand, the fifth diode D5 may be disposed between the first inductor L1 and the second node N2. Further, the sixth diode D6 may be disposed between the second inductor L2 and the fourth node N4. For instance, the fifth and sixth diodes D5 and D6, as in FIG. 10, may be disposed between the first inductor L1 and the second node N2 and between the second inductor L2 and the fourth node N4 respectively.

Figure 11:
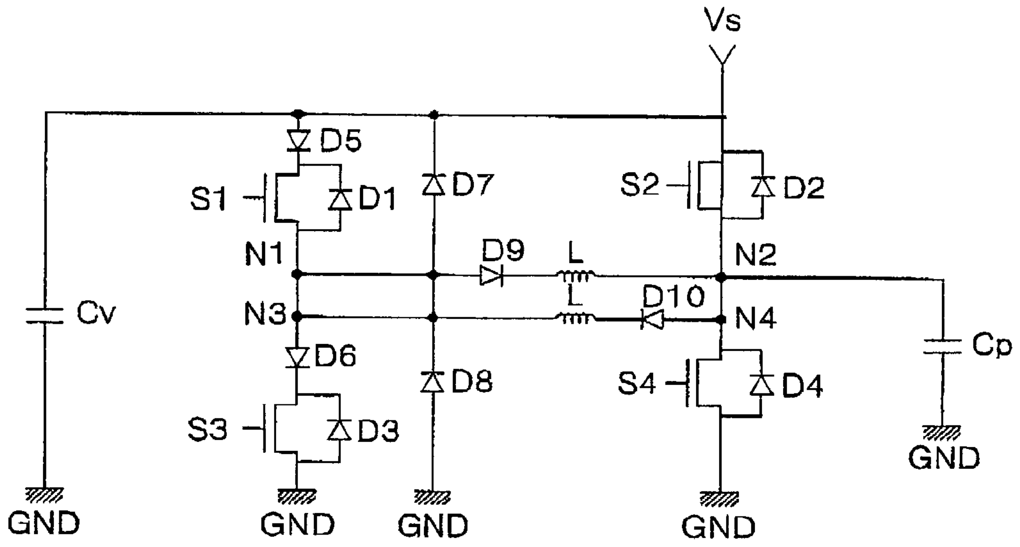
FIG. 11 illustrates a circuit diagram of an energy recovery apparatus according to still another embodiment of the present invention.

FIG. 11 illustrates a circuit diagram of an energy recovery apparatus according to still another embodiment of the present invention.

Referring to FIG. 11, the energy recovery apparatus includes a first inductor L1 providing a discharge path of a voltage charged in the power source capacitor Cv and a charging path of a current applied to the panel capacitor Cp; and a second inductor L2 providing a discharge path of a voltage charged in the panel capacitor Cp and a charging path of a current applied to the power source capacitor Cv.

There is a ninth diode D9 disposed between the first inductor L1 and a first node N1 in order to prevent a reverse current. There is a tenth diode D10 disposed between the second inductor L2 and a fourth node N4 in order to prevent a reverse current. The ninth and tenth diodes D9 and D10 are disposed to apply currents in different directions. Herein, the inductance of the second inductor L2 is set higher than the inductance of the first inductor L1.

The current discharged from the power source capacitor Cv is applied to the ground GND via the fifth diode, the first switch S1, the ninth diode D9, the first inductor L1 and the fourth switch S4. At this moment, the current is applied from the ground GND to the panel capacitor Cp via the eight diode D8, the ninth diode D9 and the first inductor L1.

The current discharged from the panel capacitor Cp is applied to the ground GND via the tenth diode D10, the second inductor L2, the sixth diode D6 and the third switch S3. At this moment, the current charged in the power source capacitor Cv is applied from the ground GND to the power source capacitor Cv via the fourth internal diode D4, the tenth diode D10, the second inductor L2 and the seventh diode D7.

On the other hand, the ninth diode D9 may be disposed between the first inductor L1 and the second node N2. In the same manner, the tenth diode 10 may be disposed between the second inductor L2 and the third node N3.

As described above, the power source capacitor is used as the source capacitor according to the energy recovery apparatus of the present invention. Further, it may be possible to control the level of the voltage charged in the power source capacitor and the panel capacitor by controlling the switching timing. Further, it may be possible to control the gradient of the voltage charged in the panel capacitor, i.e., the gradient of the sustaining pulse, by controlling the switching timing.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An energy recovery apparatus, comprising:

a sustaining voltage source for applying a sustaining voltage to a first electrode and a second electrode formed on an upper substrate;

an equivalent capacitive load formed between the first electrode and the second electrode;

a power source capacitor disposed between the sustaining voltage source and a ground;

a first switch and a third switch formed between the sustaining voltage source and the ground in parallel to the power source capacitor;

a second switch and a fourth switch formed between the sustaining voltage source and the ground in parallel to the first and third switches; and an inductor with a first end connected to the first and third switches and a second end-coupled to the second and fourth switches; and wherein the fourth switch is turned on in a first and second time period and the first switch is turned on in the second time period so a voltage charged in the power source capacitor causes a current to be applied to the inductor, the first and fourth switches are turned off in a third and fourth time period such that the current applied to the inductor is applied to the equivalent capacitive load, the third switch is turned on in a fifth time period so a voltage charged in the equivalent capacitive load causes a current to be applied to the inductor, and the third switch is turned off and the fourth switch is turned on in a time period following the fifth time period such that the current applied to the inductor is applied to the power source capacitor.

2. The energy recovery apparatus according to claim 1, wherein the second end of the inductor is connected to the equivalent capacitive load.

3. The energy recovery apparatus according to claim 1, wherein the first and second switches are connected to the sustaining voltage source and the third and fourth switches are connected to the ground.

4. The energy recovery apparatus according to claim 1, further comprising:

a first internal diode connected in parallel to the first switch, having its cathode connected to the sustaining voltage source and its anode connected to the inductor;

a second internal diode connected in parallel to the second switch, having its cathode connected to the sustaining voltage source and its anode connected to the inductor;

a third internal diode connected in parallel to the third switch, having its cathode connected to the inductor and its anode connected to the ground; and a fourth internal diode connected in parallel to the fourth switch, having its cathode connected to the inductor and its anode connected to the ground.

5. The energy recovery apparatus according to claim 1, further comprising:

a first diode disposed between the first end of the inductor and the power source capacitor;

a second diode disposed between the sustaining voltage source and the second end of the inductor;

a third diode disposed between the first end of the inductor and the ground; and a fourth diode disposed between the ground and the second end of the inductor.

6. The energy recovery apparatus according to claim 1, wherein a voltage charged in the equivalent capacitive load and a charging gradient are determined by turn-on times of the first and fourth switches.

7. The energy recovery apparatus according to claim 1, wherein a first voltage with a first gradient is charged in the equivalent capacitive load when the first and fourth switches are turned on for a first period of time, and a voltage higher than the first voltage with a second gradient higher than the first gradient is charged in the equivalent capacitive load when the first and fourth switches are turned on for longer than the first period of time.

8. The energy recovery apparatus according to claim 4, wherein a current is applied to the ground via the inductor by a voltage charged in the equivalent capacitive load when the third switch is turned on, and current is applied from the ground to the power source capacitor via the first internal diode when the third switch is turned off and the fourth switch is turned on at the same time.

9. The energy recovery apparatus according to claim 1, wherein a voltage charged in the power source capacitor and a charging gradient are determined by a turn-on time of the third switch.

10. The energy recovery apparatus according to claim 1, further including:

at least one or more other inductors connected in parallel to the inductor.

11. The energy recovery apparatus according to claim 10, wherein an inductance of said at least one or more other inductors connected in parallel to the inductor is set different from an inductance of the inductor.

12. The energy recovery apparatus according to claim 11, wherein an inductor with a low inductance among the inductors provides a path for a current charged in the equivalent capacitive load, and an inductor with a high inductance among the inductors provides a path for a current discharged from the equivalent capacitive load.

13. A method for energy recovery with an equivalent capacitive load of a panel having a first electrode and a second electrode formed on an upper substrate, a sustaining voltage source applying a sustaining voltage to at least one of the first electrode or the second electrode, and a power source capacitor disposed between the sustaining voltage source and a ground, comprising:

charging the equivalent capacitive load with a first current applied from the power source capacitor to the ground via the inductor; and charging the power source capacitor with a second current applied from the equivalent capacitive load to the ground via the inductor, wherein a third current corresponding to the first current is applied to the equivalent capacitive load via the inductor when the first current is stopped.

14. A method for energy recovery with an equivalent capacitive load of a panel having a first electrode and a second electrode formed on an upper substrate, a sustaining voltage source applying a sustaining voltage to at least one of the first electrode or the second electrode, and a power source capacitor disposed between the sustaining voltage source and a ground comprising:

charging the equivalent capacitive load with a first current applied from the power source capacitor to the ground via the inductor;

charging the power source capacitor with a second current applied from the equivalent capacitive load to the ground via the inductor, wherein a third corresponding to the second current is applied to the equivalent capacitive load via the inductor when the second current is stopped.

* * * * *